(12) United States Patent
Yamamoto

(10) Patent No.: US 8,021,509 B2
(45) Date of Patent: Sep. 20, 2011

(54) METHOD FOR AFFIXING ADHESIVE TAPE TO SEMICONDUCTOR WAFER, AND APPARATUS USING THE SAME

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 985 days.

(21) Appl. No.: 11/701,501

(22) Filed: Feb. 2, 2007

(65) Prior Publication Data
US 2007/0193671 A1 Aug. 23, 2007

(30) Foreign Application Priority Data

Feb. 22, 2006 (JP) .................................. 2006-045640

(51) Int. Cl.
*B32B 15/00* (2006.01)
(52) U.S. Cl. .......... 156/247; 156/64; 156/230; 156/249; 156/250; 156/267; 156/344

(58) Field of Classification Search ........................ None
See application file for complete search history.

(56) References Cited

U.S. PATENT DOCUMENTS

| | | | | |
|---|---|---|---|---|
| 6,231,722 B1 * | 5/2001 | Vestola | ......................... | 162/198 |
| 6,340,412 B1 * | 1/2002 | Niemi | ........................... | 162/198 |
| 2004/0140039 A1 * | 7/2004 | Yamamoto | ................... | 156/73.6 |

FOREIGN PATENT DOCUMENTS

JP 2004-025438 A 1/2004

\* cited by examiner

*Primary Examiner* — Kimberly K McClelland
(74) *Attorney, Agent, or Firm* — Cheng Law Group, PLLC

(57) ABSTRACT

A separator separating/collecting operation is controlled in correspondence with an adhesive tape supplying operation such that a separating point of a separator on an adhesive tape when supply of the adhesive tape and separation of the separator are stopped is deviated from a surface of a semiconductor wafer in a subsequent adhesive tape affixing operation.

5 Claims, 6 Drawing Sheets separation stop mark

METHOD FOR AFFIXING ADHESIVE TAPE TO SEMICONDUCTOR WAFER, AND APPARATUS USING THE SAME

BACKGROUND OF THE INVENTION (1) Field of the Invention

The present invention relates to a method for affixing an adhesive tape to a semiconductor wafer subjected to surface treatment in order to protect a surface of the semiconductor wafer, and an apparatus using this method.

(2) Description of the Related Art

JP-A 2004-025438 discloses one example of a technique for affixing an adhesive tape to a semiconductor wafer. According to this technique, an adhesive tape is separated from a separator, and is supplied onto a semiconductor wafer placed on a chuck table. Then, the adhesive tape is affixed to a surface of the semiconductor wafer by means of an affixation roller.

In such a technique, however, a semiconductor wafer is placed on the chuck table one by one; consequently, an adhesive tape affixing operation is performed intermittently. Hence, supply of an adhesive tape is stopped during an interval between adhesive tape affixing operations. More specifically, in a case that a separator attached to an adhesive tape is separated from the adhesive tape, if the separator separating operation is stopped temporarily, a streak-shaped whitish mark (separation stop mark) is put on an adhesion face of the adhesive tape at a separation point of the separator across the adhesive tape.

At the separation stop mark, the adhesion layer is varied in thickness. Hence, if the adhesive tape is affixed to a semiconductor wafer in a state that the separation stop mark overlaps with a surface of the semiconductor wafer, trouble is caused in a subsequent process such as a back grinding process in some cases. In particular, a semiconductor wafer becomes thinner and thinner in recent years. Consequently, if the semiconductor wafer is varied in thickness due to minute variation in thickness of the adhesion layer, trouble caused by an influence of the variation in the thickness of the semiconductor wafer becomes conspicuous in a subsequent process.

SUMMARY OF THE INVENTION

The present invention is devised in view of the aforementioned circumstances. An object of the present invention is to provide a method capable of affixing an adhesive tape to a semiconductor wafer with good accuracy while rendering a thickness of the adhesive tape uniform, and an apparatus using this method.

In order to accomplish the aforementioned object, the present invention adopts the following configuration.

A method for separating a separator from an adhesive tape and affixing the adhesive tape to a surface of a semiconductor wafer comprises the step of controlling a separator separating/collecting operation in correspondence with an adhesive tape supplying operation such that a separation point of the separator on the adhesive tape when supply of the adhesive tape and separation of the separator are stopped is deviated from a surface of a semiconductor wafer in a subsequent adhesive tape affixing operation.

With the method according to the present invention, in a state that after completion of one adhesive tape affixing operation, an adhesive tape is supplied onto a subsequent semiconductor wafer and supply of the adhesive tape and separation of a separator are stopped, a streak-shaped separation stop mark is put on an adhesion face of the adhesive tape at a separation point of the separator across the adhesive tape. However, this separation stop mark is deviated from the semiconductor wafer in a subsequent adhesive tape affixing operation; therefore, the adhesive tape including the separation stop mark is not affixed to a surface of the semiconductor wafer. That is, the adhesive tape having an adhesion layer being uniform in thickness is affixed to the semiconductor wafer; therefore, there is no variation in thickness of a semiconductor wafer in a subsequent back grinding process.

Preferably, the separation point is detected at a predetermined position at which the separation point is deviated from a surface of a semiconductor wafer in a subsequent adhesive tape affixing operation and is determined based on a result of the detection, when the separator is separated from the supplied adhesive tape, and in the step of controlling the separator separating/collecting operation, the separator collected in accordance with an amount of the adhesive tape to be fed is fed in a direction opposite to the separator collecting direction such that the separation point is fixed at the predetermined position when the adhesive tape is affixed to the semiconductor wafer.

With the method according to the present invention, it is possible to correctly fix a separation point of a separator at a predetermined position each time an adhesive tape is supplied onto a semiconductor wafer.

The present invention may be carried out as follows.

First, the separation point is detected by an optical sensor including a photoemitter and a photodetector arranged while being opposite to each other with the adhesive tape on an adhesive tape supply path interposed therebetween, and the separator collected in accordance with the amount of the adhesive tape to be fed is fed in a direction opposite to the separator collecting direction such that the separation point is fixed at the predetermined position based on a result of the detection.

Second, the separation point is detected by an optical sensor including a photoemitter for emitting light toward the adhesive tape on an adhesive tape supply path and a photodetector for receiving light reflected from the adhesive tape, and the separator collected in accordance with the amount of the adhesive tape to be fed is fed in a direction opposite to the separator collecting direction such that the separation point is fixed at the predetermined position based on a result of the detection.

Third, an image capturing device captures an image of the surface of the adhesive tape on an adhesive tape supply path, the separation point is monitored, and the separator collected in accordance with the amount of the adhesive tape to be fed is fed in a direction opposite to the separator collecting direction such that the separation point is fixed at the predetermined position.

In order to accomplish the aforementioned object, the present invention also adopts the following configuration.

An apparatus for separating a separator from an adhesive tape and affixing the adhesive tape to a surface of a semiconductor wafer comprises: a holding table for holding the semiconductor wafer placed thereon; adhesive tape supply means for supplying the adhesive tape to the surface of the semiconductor wafer placed on and held by the holding table; an affixing unit, provided with an affixation roller, for allowing the affixation roller to roll on the adhesive tape, to press the adhesive tape against the surface of the semiconductor wafer and to affix the adhesive tape to the surface of the semiconductor wafer; separation point detection means for detecting a separation point of the separator on an adhesive tape supply path; and separator separation/collection control means for controlling forward/backward rotation of a collection bobbin for collecting the separator and controlling a position of the separation point of the separator based on detection information of the separation point detection means such that the separation point of the separator on the adhesive tape when supply of the adhesive tape and separation of the separator are stopped is deviated from a surface of a semiconductor wafer in a subsequent adhesive tape affixing operation.

The apparatus according to the present invention can suitably implement the aforementioned method according to the present invention.

For example, the separation point detection means is an optical sensor for optically detecting a separation stop mark at the separation point of the separator on the adhesive tape supply path.

With this configuration, a streak-shaped whitish separation stop mark can be optically recognized with ease. Thus, a separation point of a separator can be detected with high accuracy.

For example, the optical sensor may include a photoemitter and a photodetector arranged while being opposite to each other with the adhesive tape on the adhesive tape supply path interposed therebetween. Alternatively, the optical sensor may include a photoemitter for emitting light onto the adhesive tape on the adhesive tape supply path, and a photodetector for receiving light reflected from the surface of the adhesive tape.

The separation point detection means may be an image capturing device disposed along the adhesive tape supply path.

In order to accomplish the aforementioned object, the present invention also adopts the following configuration.

An apparatus for separating a separator from an adhesive tape and affixing the adhesive tape to a surface of a semiconductor wafer comprises: a holding table for holding the semiconductor wafer placed thereon; adhesive tape supply means for supplying the adhesive tape to the surface of the semiconductor wafer placed on and held by the holding table; an affixing unit, provided with an affixation roller, for allowing the affixation roller to roll on the adhesive tape, to press the adhesive tape against the surface of the semiconductor wafer and to affix the adhesive tape to the surface of the semiconductor wafer; detection means for detecting a length of the adhesive tape to be supplied from the adhesive tape supply means; and separator separation/collection control means for previously determining a reference pitch of the length of the adhesive tape to be fed which is longer than a diameter of the semiconductor wafer such that the separation point of the separator on the adhesive tape when the supply of the adhesive tape and the separation of the separator are stopped is deviated from a surface of a semiconductor wafer in a subsequent adhesive tape affixing operation, for comparing a measured value of the length of the adhesive tape to be fed which is detected by the detection means with the reference pitch determined previously to obtain a position at which the both values correspond with each other as a separation stop mark when the adhesive tape supply means supplies the adhesive tape, and for controlling the position of the separation point of the separator based on a result of the obtainment.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENT

Hereinafter, description will be given of an embodiment of the present invention with reference to the drawings.

Figure 1:
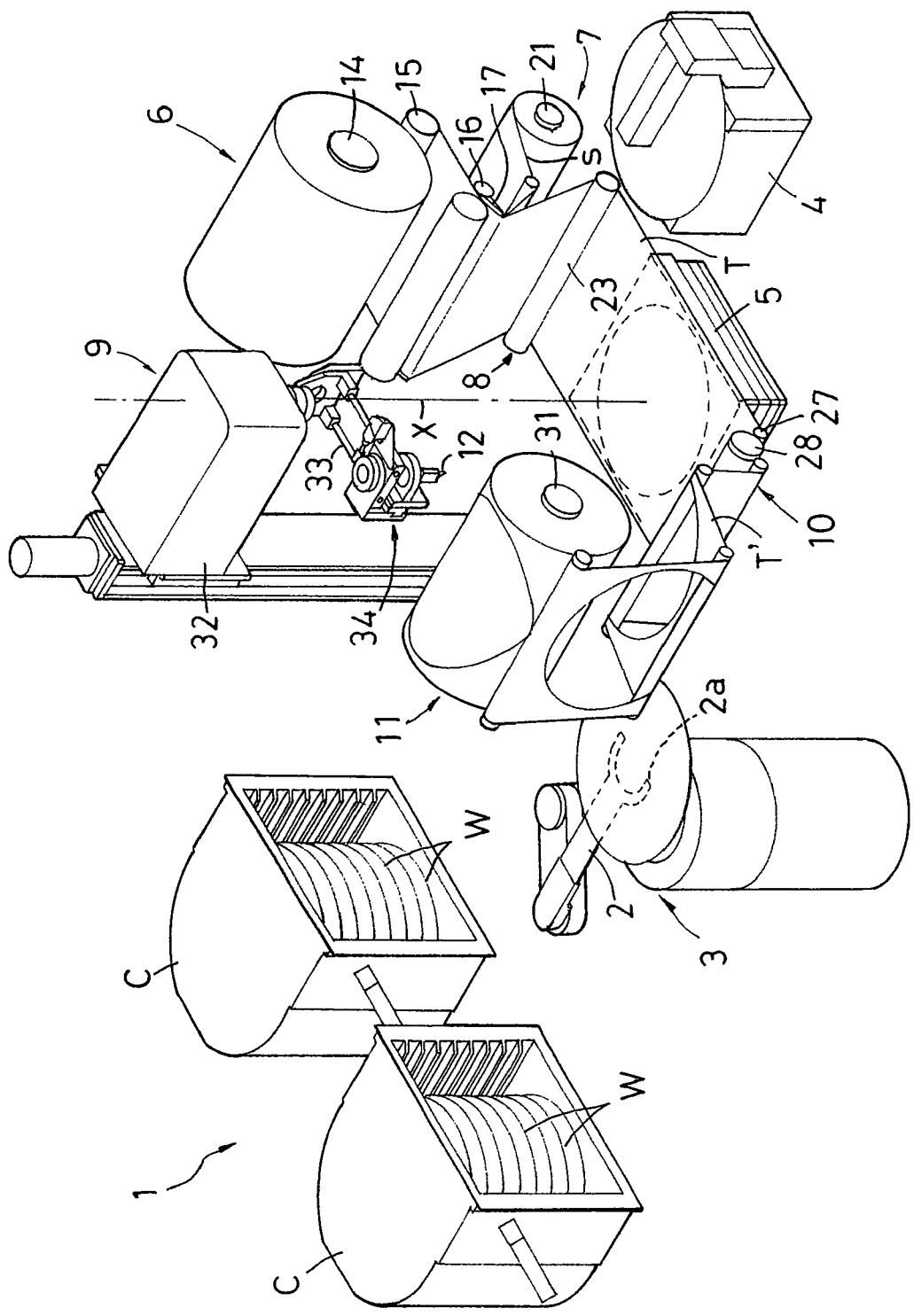
FIG. 1 is a perspective view illustrating main components of an adhesive tape affixing apparatus.

FIG. 1 is a perspective view illustrating a general configuration of an adhesive tape affixing apparatus.

The adhesive tape affixing apparatus comprises a wafer supplying/collecting section 1, a wafer transporting mechanism 3, an alignment stage (aligner) 4, a chuck table 5, a tape supplying section 6, a separator collecting section 7, an affixing unit 8, a tape cutting mechanism 9, a separating unit 10, a tape collecting section 11, and the like. Herein, the wafer supplying/collecting section 1 includes two cassettes C each housing a semiconductor wafer (hereinafter, simply referred to as "wafer") W. The wafer transporting mechanism 3 has a robot arm 2. The chuck table 5 suction-holds a wafer W placed thereon. The tape supplying section 6 supplies a translucent adhesive tape T toward a wafer W. The adhesive tape T is used for protecting a surface of a wafer W and is provided with a separator s. The separator collecting section 7 separates a separator s from an adhesive tape T supplied from the tape supplying section 6, and collects the separator s. The affixing unit 8 affixes an adhesive tape T to a wafer W placed on and suction-held by the chuck table 5. The tape cutting mechanism 9 cuts an adhesive tape T affixed to a wafer W along an outer periphery of the wafer W. The separating unit 10 separates an unnecessary tape T' from an adhesive tape T which is affixed to a wafer W and, then, is cut along an outer periphery of the wafer W. The tape collecting section 11 collects an unnecessary tape T' separated by the separating unit 10 while reeling the unnecessary tape T'. Hereinafter, detailed description will be given of the aforementioned structural components.

In the wafer supplying/collecting section 1, the two cassettes C are arranged in parallel. Stacked wafers W, each having a wiring pattern face directed upward, are housed in each cassette C in a horizontal position.

The robot arm 2 of the wafer transporting mechanism 3 is movable horizontally. Further, the robot arm 2 is turnable and movable vertically as a whole. The robot arm 2 has a tip end provided with a horse shoe-shaped wafer holding part 2a of a vacuum suction type. The wafer holding part 2a is inserted between wafers W housed in the cassette C and suction-holds a back side (bottom side) of the upper wafer W. Then, the wafer holding part 2a pulls out the wafer W from the cassette C and transfers the wafer W to the alignment stage 4, the chuck table 5 and the wafer supplying/collecting section 1 in this order.

The alignment stage 4 performs alignment on a wafer W transferred thereto and placed thereon by the wafer transporting mechanism 3 based on a notch or an orientation flat formed at an outer periphery of the wafer W.

The chuck table 5 vacuum-sucks a wafer W transferred thereto by the wafer transporting mechanism 3 and placed thereon in a predetermined alignment position. A cutter traveling groove 13 (see FIG. 3) is formed on a top face of the chuck table 5. In the cutter traveling groove 13, a cutter blade 12 of the tape cutting mechanism 9 (to be described later) turns along an outer periphery of a wafer W, thereby to cut an adhesive tape T affixed to the wafer W. In addition, a suction-holding part 5a (see FIG. 2) is provided on a center of the chuck table 5 so as to protrude from/retreat into the chuck table 5 upon transfer of a wafer W.

Figure 2:
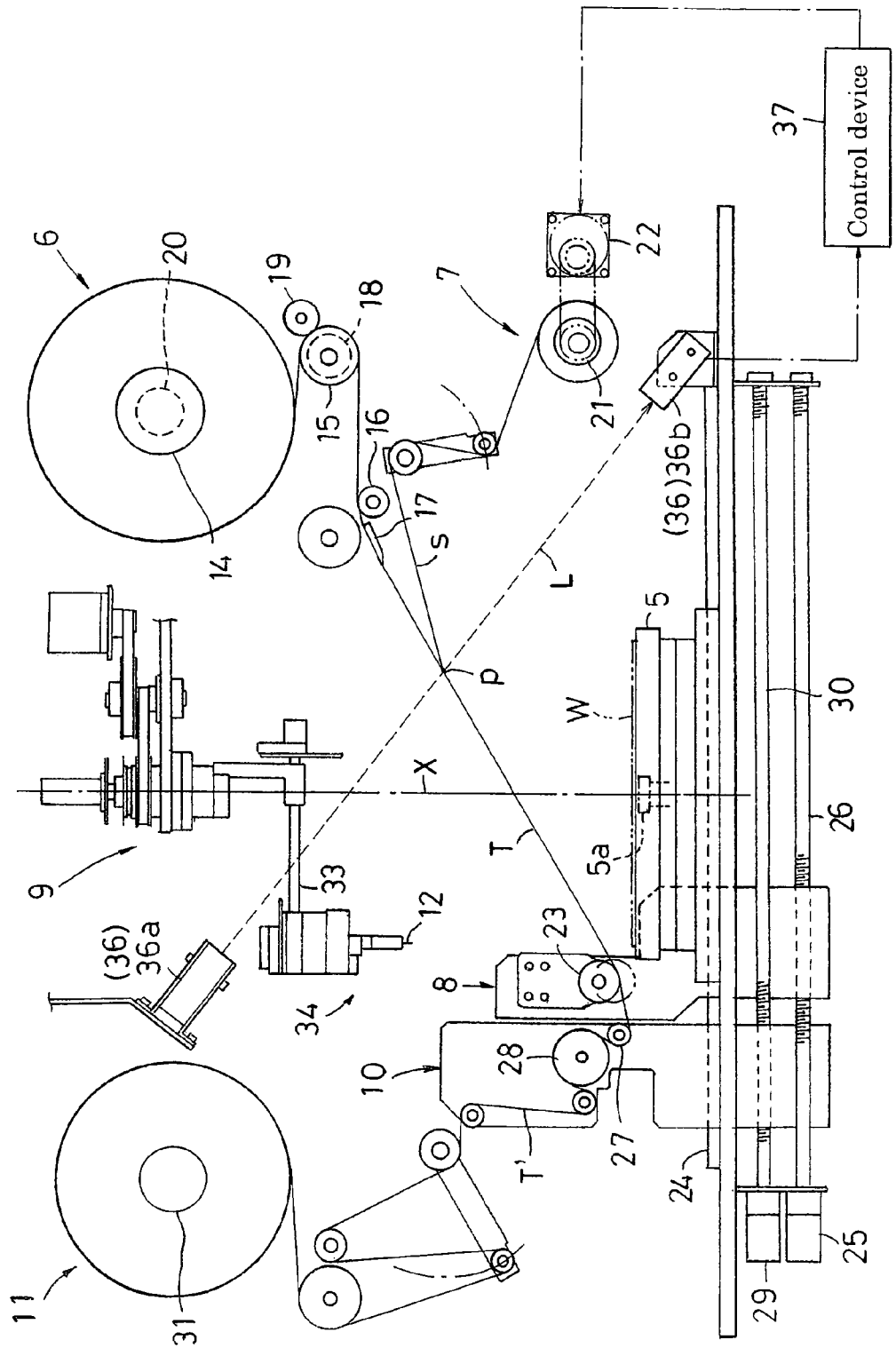
FIG. 2 is a front view illustrating the adhesive tape affixing apparatus.

In the tape supplying section 6, as illustrated in FIG. 2, a feed roller 15 and a guide roller 16 guide an adhesive tape T with a separator s, which is fed from a supply bobbin 14, toward a separation guide bar 17 formed into an edge of a knife. The adhesive tape T is folded back at a leading edge of the separation guide bar 17 and, then, is separated from the separator s. Further, the adhesive tape T separated from the separator s is guided toward the affixing unit 8.

The feed roller 15 pinches an adhesive tape T in cooperation with a pinch roller 19, and is rotated by a motor 18. If necessary, the feed roller 15 forcibly feeds an adhesive tape T.

The supply bobbin 14 is interlocked with and coupled to an electromagnetic brake 20 so as to receive appropriate rotational resistance. As a result, an adhesive tape T is prevented from being excessively fed from the supply bobbin 14.

The separator collecting section 7 includes a collection bobbin 21 reeling a separator s separated from an adhesive tape T, and a motor 22 controls forward/backward rotation of the collection bobbin 21.

The affixing unit 8 includes an affixation roller 23 a position of which is changeable vertically by a cylinder (not illustrated). As a whole, the affixing unit 8 is supported on a guide rail 24 so as to be movable horizontally along the guide rail 24, and is allowed to reciprocate through a screw shaft 26 rotated by a motor 25 in a forward/backward direction.

The separating unit 10 includes a separation roller 27, and a feed roller 28 driven by a motor. As a whole, the separating unit 10 is supported on the guide rail 24 so as to be movable horizontally along the guide rail 24, and is allowed to reciprocate through a screw shaft 30 rotated by a motor 29 in the forward/backward direction.

The tape collecting section 11 includes a collection bobbin 31 driven by a motor and is rotated in a direction of reeling an unnecessary tape T'.

In the tape cutting mechanism 9, a support arm 33 is provided below a bench 32 movable vertically, so as to turn about a vertical axis X on the center of the chuck table 5. The support arm 33 has a free end provided with a cutter unit 34, and the cutter unit 34 includes the cutter blade 12 having a blade edge directed downward. When the support arm 33 turns about the vertical axis X, the cutter blade 12 travels along an outer periphery of a wafer W, thereby to cut an adhesive tape T affixed to the wafer W.

With reference to FIGS. 2 to 7, next, description will be given of a sequence of basic operations for affixing an adhesive tape T to a surface of a wafer W, in order to protect the surface of the wafer W, by means of the apparatus according to this embodiment.

Upon acceptance of an adhesive tape affixing command, first, the robot arm 2 of the wafer transporting mechanism 3 moves toward the cassette C of the wafer supplying/collecting section 1, and the wafer holding part 2a is inserted between wafers W housed in the cassette C. Then, the wafer holding part 2a suction-holds a back side (bottom side) of the upper wafer W, pulls out the wafer W from the cassette C, and transfers the wafer W to the alignment stage 4.

The alignment stage 4 performs alignment on the wafer W placed thereon based on a notch or an orientation flat formed at an outer periphery of the wafer W. After performance of the alignment, the robot arm 2 holds the wafer W on the alignment stage 4 and transfers the wafer W to the chuck table 5.

The chuck table 5 suction-holds the wafer W placed thereon such that a center of the chuck table 5 is aligned with a center of the wafer W. Herein, as illustrated in a left side of FIG. 2, the affixing unit 8 and the separating unit 10 are in initial positions, respectively. In addition, as illustrated in an upper side of FIG. 2, the cutter blade 12 of the tape cutting mechanism 9 is in an initial position on standby.

Figure 3:
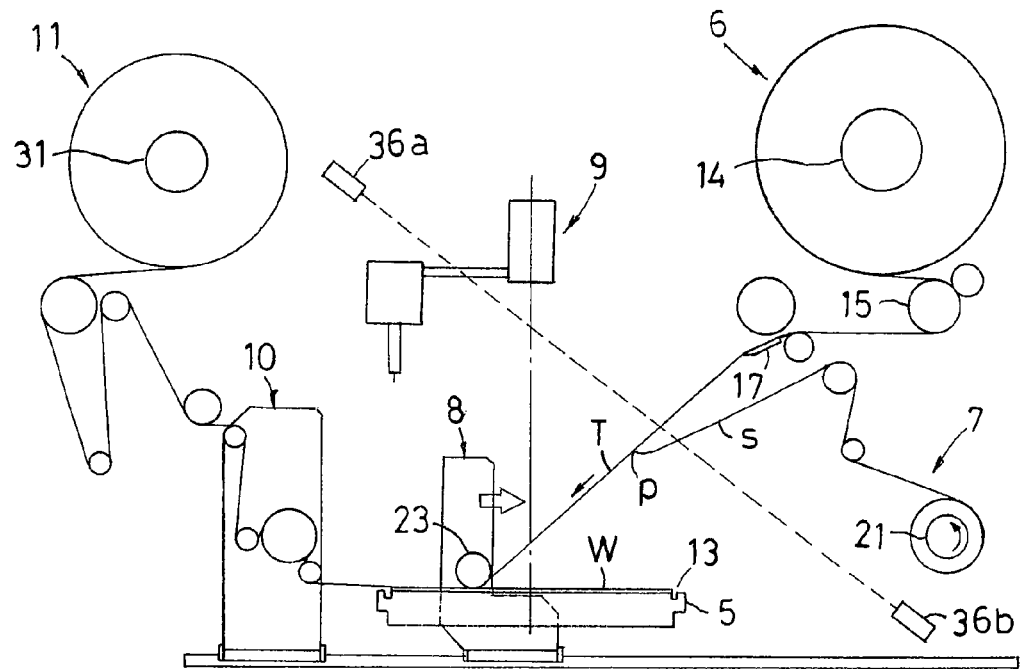
FIG. 3 is a front view illustrating an adhesive tape affixing step.

Next, as illustrated in FIG. 3, the affixation roller 23 moves downward and the affixing unit 8 moves forward. Then, the affixation roller 23 rolls forward (rightward in FIG. 3) on an adhesive tape T while pressing the adhesive tape T against the wafer W. Herein, the adhesive tape T is gradually affixed to a surface of the wafer W from left to right in FIG. 3.

Figure 4:
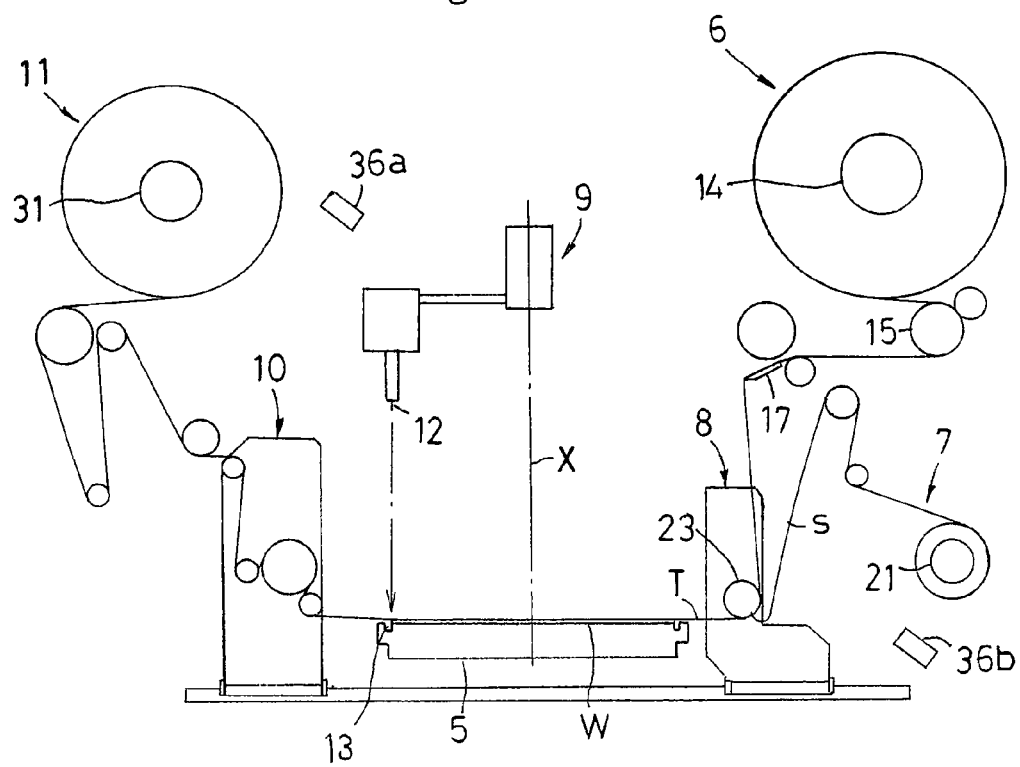
FIG. 4 is a front view illustrating an adhesive tape affixing step.

Next, as illustrated in FIG. 4, when the affixing unit 8 reaches a termination position beyond the chuck table 5, the cutter blade 12 situated above the chuck table 5 on standby moves downward, and the adhesive tape T is stuck with the cutter blade 12 at the cutter traveling groove 13 of the chuck table 5.

Figure 5:
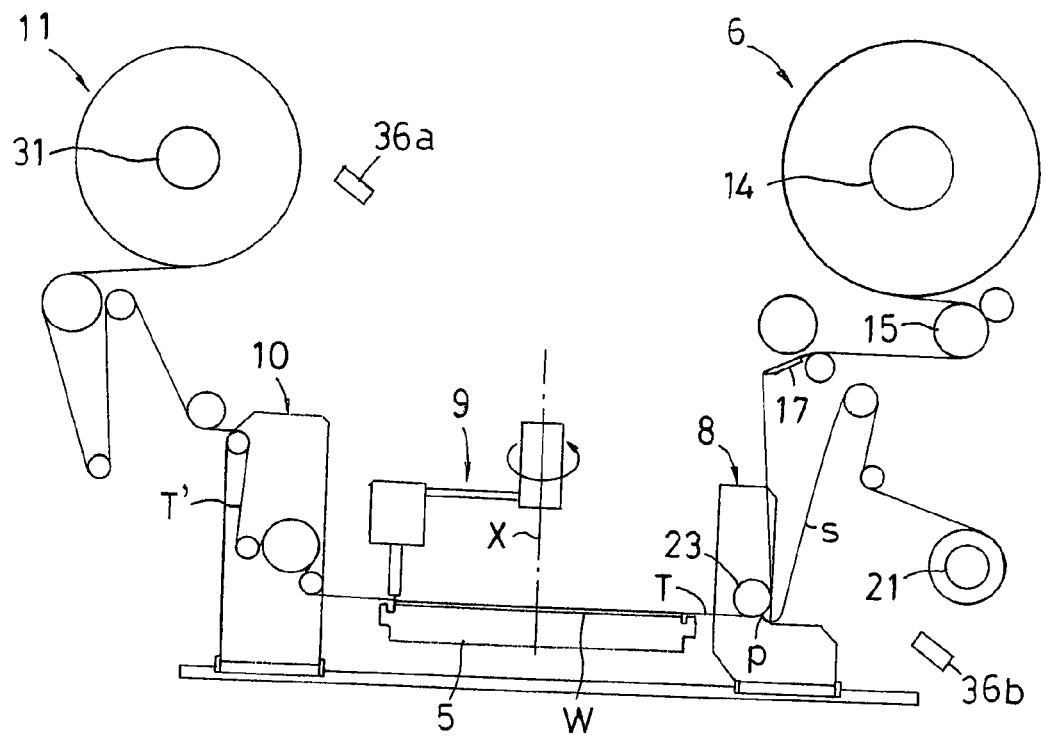
FIG. 5 is a front view illustrating an adhesive tape affixing step.

Next, as illustrated in FIG. 5, when the cutter blade 12 moves downward and stops at a position corresponding to a predetermined height, the support arm 33 is rotated in a predetermined direction. Thus, the cutter blade 12 turns about the vertical axis X to cut the adhesive tape T along the outer periphery of the wafer W.

Figure 6:
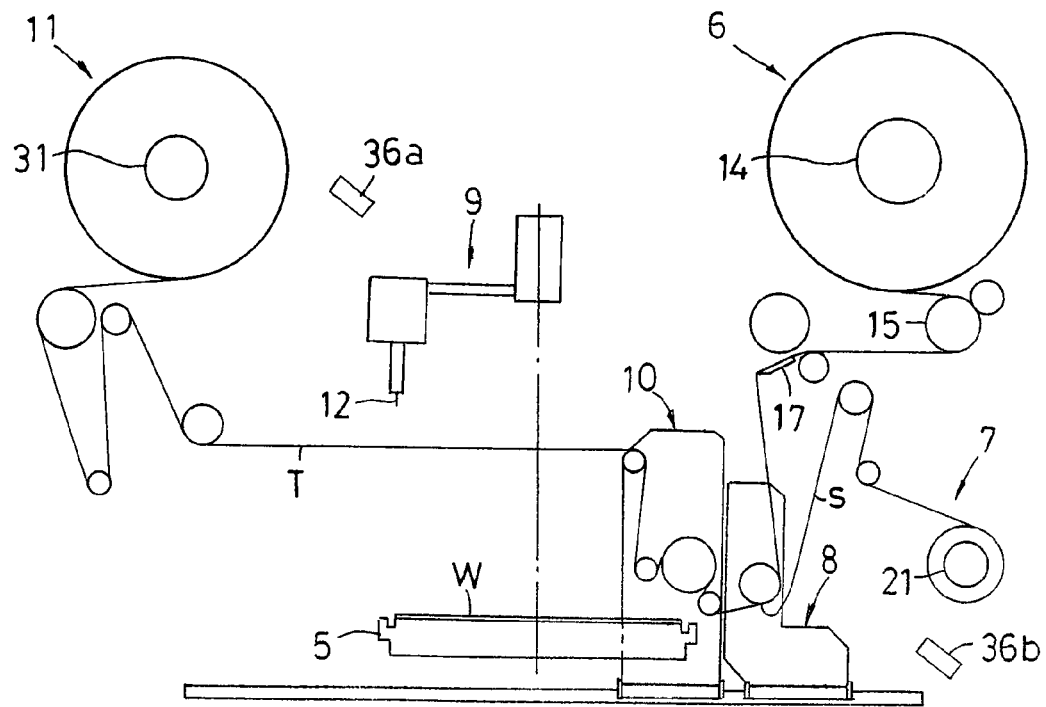
FIG. 6 is a front view illustrating an adhesive tape affixing step.

Next, as illustrated in FIG. 6, after completion of the cutting of the adhesive tape T along the outer periphery of the wafer W, the cutter blade 12 moves upward so as to return to the initial position. Further, the separating unit 10 moves forward to separate an unnecessary tape T' from the adhesive tape T, which is affixed to the wafer W and is cut along the outer periphery of the wafer W, while reeling the unnecessary tape T'.

Figure 7:
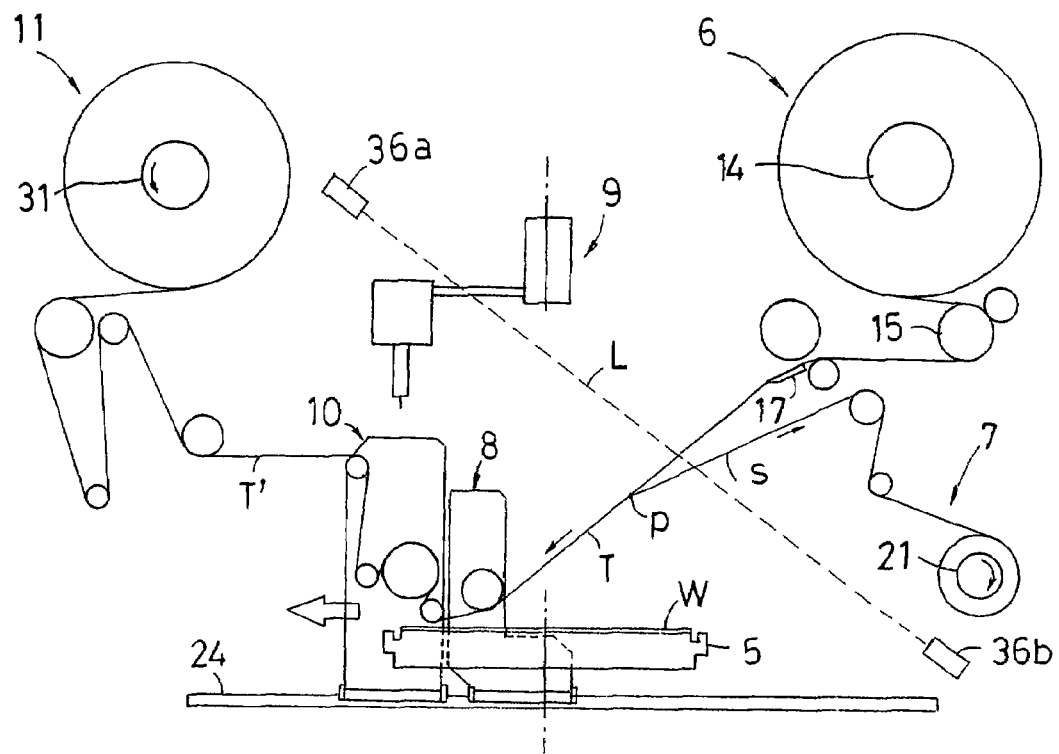
FIG. 7 is a front view illustrating an adhesive tape affixing step.

Next, as illustrated in FIG. 7, when the separating unit 10 reaches a termination position of the separation, the separating unit 10 and the affixing unit 8 move in a reverse direction so as to return to the initial positions, respectively. Herein, the collection bobbin 31 reels the unnecessary tape T' and the tape supplying section 6 supplies an adhesive tape T by a predetermined amount.

After completion of the adhesive tape affixing operation, the chuck table 5 releases the suction of the wafer W, and the suction-holding part 5a holds the wafer W and lifts the wafer W upward. Then, the wafer holding part 2a of the robot arm 2 holds the wafer W and inserts the wafer W into the cassette C of the wafer supplying/collecting section 1.

Thus, an adhesive tape affixing process is completed. Thereafter, the aforementioned operations are sequentially performed in a repetitive manner.

Figure 9:
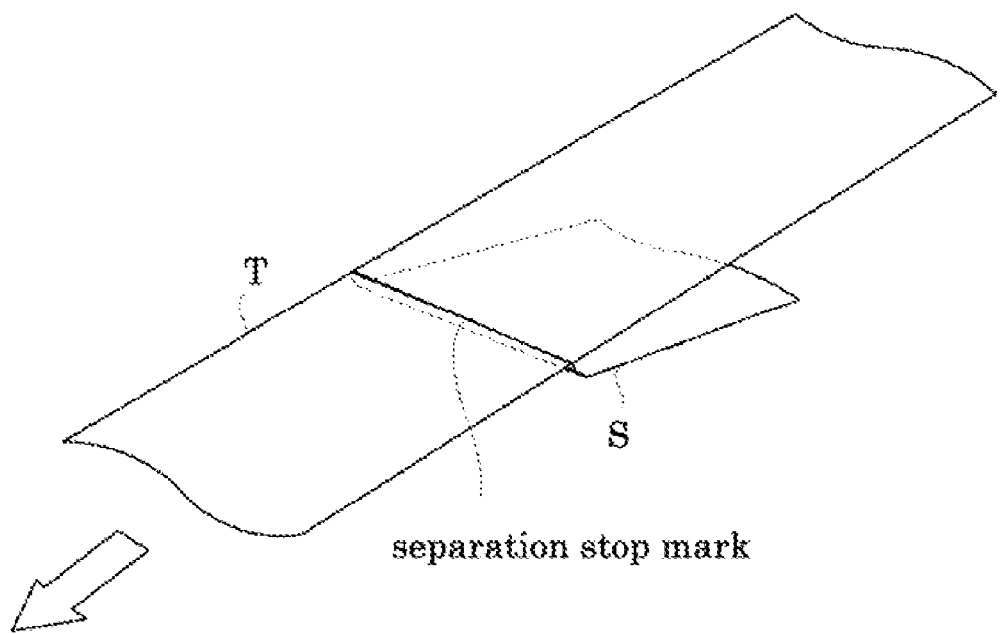
FIG. 9 is a prospective view illustrating a separation stop mark on an adhesive tape.

In the aforementioned adhesive tape affixing process, when movement of an adhesive tape T is stopped, a streak-shaped whitish mark (separation stop mark) is put on an adhesion face of the adhesive tape T at a separation point p of a separator s across the adhesive tape T, as illustrated in FIG. 2 and FIG. 9. In order to prevent that this separation stop mark overlaps with a surface of a subsequent wafer W upon affixation of the adhesive tape T to the wafer W, a separator collecting operation is controlled in correspondence with an adhesive tape affixing operation in the following manners.

That is, at a start of the adhesive tape affixing operation, as illustrated in FIG. 2, the separation point p of the separator s is in a predetermined position located in front of the separation guide bar 17. At this predetermined position, no separation stop mark overlaps with a surface of a subsequent wafer W upon affixation of an adhesive tape T to the wafer W.

When the affixing unit 8 moves forward to start the adhesive tape affixing operation, a control device 37 controls the rotation of the collection bobbin 21 of the separator collecting section 7 such that the collection bobbin 21 is rotated in the reverse direction so as to feed the separator s as the adhesive tape T is fed from the supply bobbin 14. That is, the separator s moves together with the adhesive tape T without being separated from the adhesive tape T. In other words, the position of the separation point p of the separator s is fixed during the adhesive tape affixing operation.

After completion of the adhesive tape affixing operation, the position of the separation point p is fixed with respect to the adhesive tape T during an adhesive tape cutting operation and an unnecessary tape separating operation. Thus, the separation stop mark is put on the adhesion face of the adhesive tape T at the separation point p.

Thereafter, the separating unit 10 and the affixing unit 8 move in the reverse direction to return to the initial positions, respectively, and the collection bobbin 21 reels and collects the separator s. Then, the adhesive tape T fed from the tape supplying section 6 is supplied onto the chuck table 5.

In the adhesive tape supplying operation, the collection bobbin 21 of the separator collecting section 7 is rotated so as to reel the separator s, and the separator s is separated from the adhesive tape T again; thus, the separation point p of the separator s moves with respect to the adhesive tape T.

Figure 8:
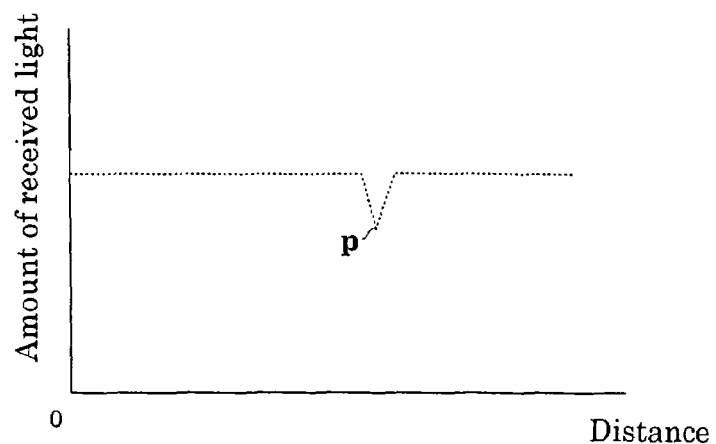
FIG. 8 shows a status of a separation point detected by an optical sensor.

Herein, there is used a transparent optical sensor 36 including a photoemitter 36a and a photodetector 36b. As illustrated in FIG. 2, the photoemitter 36a and the photodetector 36b are provided above and below an adhesive tape supply path, and are connected to the control device 37. The optical sensor 36 has an optical axis L intersecting the adhesive tape supply path at a predetermined position upon start of the adhesive tape affixing operation. That is, when the separation point p moving by the collection of the separator s reaches the optical axis L of the optical sensor 36, as illustrated in FIG. 8, the optical sensor 36 detects the separation point p based on a decrease in amount of light received by the photodetector 36b. Then, the control device 37 controls the rotation of the motor 22 based on information about the detection by the photodetector 36b; thus, the rotation of the collection bobbin 21 is stopped and the collection of the separator s is stopped. It is to be noted that the control device 37 corresponds to separator separation/collection control means in the present invention.

As a result, as illustrated in FIG. 2, the separation point p is in the predetermined position at which no separation stop mark overlaps with a surface of a wafer upon start of the adhesive tape affixing operation.

The photoemitter 36a is changed in angle and the photodetector 36b is changed in forward/rearward position and angle such that the light axis L of the optical sensor 36 is adjusted in the forward/rearward direction. Thus, it is possible to adjust the position of the separation point p upon stop of movement of an adhesive tape T in accordance with a size of a wafer W to be used.

As described above, a position of a separation point p of a separator s is determined and is fixed upon affixation of an adhesive tape T to a wafer W, so that the adhesive tape T including a separation stop mark at the separation point p is prevented from being affixed to the wafer W Accordingly, in the adhesive tape T, a portion having an adhesive layer changed in thickness due to the separation stop mark is deviated from a surface of the wafer W. Therefore, the wafer W is uniform in thickness in a subsequent back grinding process.

The present invention may be embodied as follows.

(1) In the aforementioned embodiment, a separation point p of a separator s is optically detected in order to collect the separator s; thus, a position of a separation stop mark is controlled. Alternatively, forward/backward rotation of the collection bobbin 21 for collecting the separator s is controlled based on a preset program in synchronization with an adhesive tape feeding operation. Thus, the position of the separation stop mark can be controlled.

For example, a memory in the control device 37 stores a predetermined reference pitch of a length of an adhesive tape T to be fed, which is longer than a diameter of a wafer W, such that a separation point of a separator s on the adhesive tape T when supply of the adhesive tape T and separation of the separator s are stopped is deviated from a surface of a wafer W in a subsequent adhesive tape affixing operation.

Then, when the adhesive tape T is fed from the tape supplying section 6, an encoder in a driving mechanism such as a motor detects a length (measured value) of the adhesive tape T to be fed. The control device 37 compares the measured value detected herein with the predetermined reference pitch to obtain a position at which the both values correspond with each other as a separation stop mark.

Further, under control by the control device 37 based on the obtained separation stop mark, the separator s is fed in a direction opposite to a separator collecting direction such that the separation point p of the separator s does not overlap with a surface of a wafer W.

(2) The optical sensor 36 that optically detects a separation point p of a separator s may be of a reflection type. Alternatively, an image capturing device such as an optical camera captures an image of an adhesive tape T, and the separation point p of the separator s can be detected through analysis of the image.

(3) If a self weight (e.g., mass per unit area) of an adhesive tape T is heavier than that of a separator s, torque applied to the collection bobbin 21 for collecting the separator s is released; thus, the separator s can be fed from the collection bobbin 21 upon affixation of the adhesive tape T to a wafer W. That is, the feed of the separator s can be appropriately changed to, for example, feed under control by a motor, feed in a torque free state, and the like, in accordance with a type of an adhesive tape to be used.

(4) After determination of a separation point p of a separator s, an amount of an adhesive tape T to be fed is detected based on a rotation amount of the motor 18 of the feed roller 15, and a rotation amount of the motor 22 is controlled in synchronization with a result of the detection so as to feed the separator s.

(5) In the aforementioned embodiment, as an example, the apparatus affixes an adhesive tape to a semiconductor wafer in order to protect a surface of the semiconductor wafer. However, the present invention may be applicable to various apparatuses for separating a separator from an adhesive tape and affixing the adhesive tape to a workpiece. For example, the present invention is applicable to an apparatus for affixing a supporting adhesive tape to a ring frame, wherein a semiconductor wafer is placed on and held by an adhesion face of the supporting adhesive tape.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for separating a separator from an adhesive tape and affixing the adhesive tape to a surface of a semiconductor wafer, the method comprising the steps of:

supplying the adhesive tape intermittently while separating the adhesive tape from the separator;

controlling a separator separating/collecting operation in synchronization with the supplying of the adhesive tape to form a separation stop mark on the adhesive tape and locate the separation stop mark at a predetermined position to prevent the separation stop mark from overlapping with a surface of a semiconductor wafer during the affixation of the adhesive tape on the semiconductor wafer; and affixing the adhesive tape to the surface of the semiconductor wafer such that the separation stop mark is deviated from being affixed on the surface of the semiconductor wafer;

wherein the separation stop mark is formed on the adhesive tape due to stopping of supply of the adhesive tape and the stopping of separation of the separator, and wherein the separator separating/collecting operation is controlled in synchronization with the supplying of the adhesive tape by controlling via a control device the forward/backward rotation of a collection bobbin for collecting the separator and controlling the supplying of the adhesive tape from a supply bobbin.

2. The method of claim 1, wherein in the step of supplying the adhesive tape intermittently, the separation stop mark is detected on a supply path at the predetermined position where the separation stop mark appears to the semiconductor wafer; and in the step of controlling the separator separating/collecting operation, the separator collected in accordance with an amount of the adhesive tape to be fed is fed in a direction opposite to the separator collecting direction such that the separation stop mark is fixed at the predetermined position when the adhesive tape is affixed to the semiconductor wafer.

3. The method of claim 2, wherein in the step of detecting, the separation stop mark is detected by an optical sensor including a photoemitter and a photodetector arranged while being opposite to each other with the adhesive tape on an adhesive tape supply path interposed therebetween, and in the step of controlling the separator separating/collecting operation, the separator collected in accordance with the amount of the adhesive tape to be fed is fed in a direction opposite to the separator collecting direction such that the separation stop mark is fixed at the predetermined position based on a result of the detection.

4. The method of claim 2, wherein in the step of detecting, the separation stop mark is detected by an optical sensor including a photoemitter for emitting light toward the adhesive tape on an adhesive tape supply path and a photodetector for receiving light reflected from the adhesive tape, and in the step of controlling the separator separating/collecting operation, the separator collected in accordance with the amount of the adhesive tape to be fed is fed in a direction opposite to the separator collecting direction such that the separation stop mark is fixed at the predetermined position based on a result of the detection.

5. The method of claim 2, wherein in the step of detecting, an image capturing device captures an image of the surface of the adhesive tape on an adhesive tape supply path, the separation stop mark is monitored, and in the step of controlling the separator separating/collecting operation, the separator collected in accordance with the amount of the adhesive tape to be fed is fed in a direction opposite to the separator collecting direction such that the separation stop mark is fixed at the predetermined position.

* * * * *